(12) United States Patent
Xie et al.

(10) Patent No.: US 8,928,006 B2
(45) Date of Patent: Jan. 6, 2015

(54) SUBSTRATE STRUCTURE, METHOD OF FORMING THE SUBSTRATE STRUCTURE AND CHIP COMPRISING THE SUBSTRATE STRUCTURE

(75) Inventors: Chunlin Xie, Guangdong (CN); Xilin Su, Guangdong (CN); Hongpo Hu, Guangdong (CN); Wang Zhang, Guangdong (CN)

(73) Assignees: Shenzhen BYD Auto R&D Company Limited, Shenzhen (CN); BYD Company Limited, Shenzhen (CN)

( * ) Notice: Subject to any disclaimer, the term of this patent is extended or adjusted under 35 U.S.C. 154(b) by 0 days.

(21) Appl. No.: 13/988,724

(22) PCT Filed: Feb. 21, 2012

(86) PCT No.: PCT/CN2012/071402
§ 371 (c)(1),
(2), (4) Date: Aug. 12, 2013

(87) PCT Pub. No.: WO2012/116607
PCT Pub. Date: Sep. 7, 2012

(65) Prior Publication Data
US 2013/0320355 A1 Dec. 5, 2013

(30) Foreign Application Priority Data
Feb. 28, 2011 (CN) .......................... 2011 1 0046555

(51) Int. Cl.
*H01L 33/00* (2010.01)
(Continued)

(52) U.S. Cl.
CPC ............. *H01L 33/20* (2013.01); *H01L 33/02* (2013.01); *H01L 21/02658* (2013.01);
(Continued)

(58) Field of Classification Search
USPC .................. 257/79, 622, E21.133, E21.566; 438/341, 481
See application file for complete search history.

(56) References Cited

U.S. PATENT DOCUMENTS 6,841,808 B2 * 1/2005 Shibata et al. ................ 257/190
7,427,772 B2 * 9/2008 Chuo et al. ...................... 257/13
(Continued)

FOREIGN PATENT DOCUMENTS

| CN | 101090143 A | 12/2007 |
|---|---|---|
| CN | 101345274 A | 1/2009 |
| CN | 101685768 A | 3/2010 |

OTHER PUBLICATIONS

International Search Report dated May 17, 2012 for corresponding International Patent Application No. PCT/CN2012/071402.

*Primary Examiner* — Daniel Whalen
(74) *Attorney, Agent, or Firm* — David D. Brush; Westman, Champlin & Koehler, P.A.

(57) ABSTRACT

A groove structure formed on a surface of a substrate. The groove structure includes a lateral epitaxial pattern in a cross section perpendicular to the surface, which has: a first edge inclined to the surface; a second edge adjacent to first edge and parallel to the surface; a third edge parallel to the first edge, having a projection on the surface covering the second edge; and a fourth edge adjacent to the third edge. A first intersection between the second edge and the third edge on the second edge and an injection of a second intersection between the third edge and the fourth edge on the second edge are located on two sides of a third intersection between the first edge and the second edge, or the injection of the second intersection between the third edge and the fourth edge on the second edge coincides with the third intersection.

19 Claims, 7 Drawing Sheets

(51) Int. Cl.
    *H01L 29/06*     (2006.01)
    *H01L 33/02*     (2010.01)
    *H01L 33/20*     (2010.01)
    *H01L 21/02*     (2006.01)
    *H01L 33/32*     (2010.01)
    *C30B 25/18*     (2006.01)

(52) U.S. Cl.
CPC .......... *H01L 33/007* (2013.01); *H01L 21/0237* (2013.01); *H01L 29/06* (2013.01); *H01L 21/02458* (2013.01); *H01L 21/0243* (2013.01); *H01L 33/32* (2013.01); *H01L 21/0254* (2013.01); *C03B 29/403* (2013.01); *C30B 25/186* (2013.01)

USPC   257/79; 257/622; 257/E21.133; 257/E21.566; 438/341; 438/481

(56) References Cited

U.S. PATENT DOCUMENTS

| | | |
|---|---|---|
| 2003/0162340 A1 | 8/2003 | Tezen |
| 2004/0113166 A1* | 6/2004 | Tadatomo et al. .............. 257/98 |
| 2004/0119084 A1* | 6/2004 | Hsieh et al. ..................... 257/98 |
| 2008/0251803 A1* | 10/2008 | Cho et al. ........................ 257/94 |
| 2010/0197055 A1* | 8/2010 | Tanaka et al. ................... 438/29 |
| 2011/0012109 A1 | 1/2011 | Ishikawa et al. |

* cited by examiner

SUBSTRATE STRUCTURE, METHOD OF FORMING THE SUBSTRATE STRUCTURE AND CHIP COMPRISING THE SUBSTRATE STRUCTURE

CROSS-REFERENCE TO RELATED APPLICATION

This Application is a Section 371 National Stage Application of International Application No. PCT/CN2012/071402, filed Feb. 21, 2012, which is incorporated by reference in its entirety and published as WO 2012/116607 on Sep. 7, 2012, in English, which claims priority to and benefits of Chinese Patent Application No. 201110046555.6, filed with State Intellectual Property Office, P. R. C. on Feb. 28, 2011, the entire content of which is incorporated herein by reference.

FIELD

The present disclosure relates to solid state lighting, and more particularly relates to a substrate structure, a method of forming the substrate structure, and a chip comprising the substrate structure.

BACKGROUND

A light emitting diode (LED) is a luminous conductive chip having a P-N junction structure, and the main raw material for forming the LED is gallium nitride (GaN). GaN is widely used in the research and industry of semiconductor and solid state lighting, because of its advantages of high efficiency, long life span, and environment friendliness. Group III-V nitrides, for example, GaN, InGaN, AlGaN, and AlGaInN, have an adjustable direct bandwidth of 0.7 eV to 6.2 eV, which covers the spectral range from the bandwidth of ultraviolet (UV) light to that of infrared light. Thus, such nitrides are considered as the most suitable materials for fabricating devices emitting blue light, green light or white light.

Presently, a GaN-based LED generally comprises a GaN layer heteroepitaxially grown on a flat substrate thereof. The substrate includes a sapphire substrate, a silicon carbide substrate, and a silicon substrate. Due to large lattice constant mismatch and large thermal expansion coefficient difference between the substrate and the GaN epitaxial layer, a large number of stress defects and crystal defects may be generated in the GaN epitaxial layer. These defects may form some nonradiative recombination centers, and may decrease the performance of the GaN layer and further influence the internal quantum efficiency of the LED accordingly.

The lateral epitaxial growth of the GaN epitaxial layer on the substrate is commonly achieved by a process of lateral epitaxial overgrowth or suspension epitaxial growth so as to reduce the density of defects in the epitaxial layer and improve the quality of crystal in the epitaxial layer. However, the process includes two steps during which the growth of the epitaxial layer may be disturbed. Moreover, the process is not only complicated but also costs too much. Therefore, the fabricating and the application of such LEDs are limited. The lateral epitaxial growth of the GaN layer may also be achieved by a substrate having patterned areas. But the lateral epitaxial growth of the GaN layer may only be performed in the patterned areas, while the lateral epitaxial growth may not be performed in the remaining areas. In such remaining areas, the defect density is still very high, for example, $10^8$, and consequently existence of nonradiative recombination centers may be caused. Accordingly, the internal quantum efficiency and the performance of the LED may be reduced.

SUMMARY

According to an aspect of the present disclosure, a substrate structure may be provided. The substrate structure may comprise: a substrate; and at least a groove structure formed on a surface of the substrate, the groove structure having a lateral epitaxial pattern in a cross section perpendicular to the surface of the substrate, in which the lateral epitaxial pattern comprises: a first edge inclined with respect to the surface of the substrate; a second edge adjacent to the first edge and parallel to the surface of the substrate; a third edge parallel to the first edge, having a projection on the surface of the substrate at least entirely covering the second edge; and a fourth edge adjacent to the third edge, in which the second edge is the bottom of the groove structure; and an intersection point between the second edge and the third edge on the second edge and an injection of an intersection point between the third edge and the fourth edge on the second edge are located on two sides of an intersection point between the first edge and the second edge, or the injection of the intersection point between the third edge and the fourth edge on the second edge coincides with the intersection point between the first edge and the second edge.

According to another aspect of the present disclosure, a method of forming the substrate structure may be provided. The method may comprise the steps of: 1) providing a substrate; 2) forming a first photoresist layer on a surface of the substrate; 3) exposing and developing the first photoresist layer by a first mask, and an angle between the surface of the substrate and a direction of incident lights in the exposing step being an acute angle; 4) firstly dry etching the substrate to form at least a first groove, in which a direction of the first dry etching is the same as the direction of the incident lights in the exposing step in the step 3); 5) forming a second photoresist layer covering the surface formed with the first groove; 6) exposing and developing the second photoresist layer by a second mask, and forming the second photoresist layer above the first groove; and 7) secondly dry etching the substrate to form at least a groove structure, the groove structure having a lateral epitaxial pattern in a cross section perpendicular to the surface of the substrate, and a direction of the second dry etching in the step 7) being the same as a direction of incident lights in the exposing step in the step 6), in which the lateral epitaxial pattern comprises: a first edge inclined with respect to the surface of the substrate; a second edge adjacent to the first edge and parallel to the surface of the substrate; a third edge parallel to the first edge, having a projection on the surface of the substrate at least entirely covering the second edge; and a fourth edge adjacent to the third edge, in which the second edge is the bottom of the groove structure; and an intersection point between the second edge and the third edge on the second edge and an injection of an intersection point between the third edge and the fourth edge on the second edge are located on two sides of an intersection point between the first edge and the second edge, or the injection of the intersection point between the third edge and the fourth edge on the second edge coincides with the intersection point between the first edge and the second edge.

According to yet another aspect of the present disclosure, a chip may be provided. The chip may comprise a substrate structure described above, and an LED structure formed on the substrate structure.

In the initial growth period, the growth of the GaN epitaxial layer is limited in an area formed by the first edge, the second edge and the third edge. Because the intersection point between the second edge and the third edge on the second edge and the injection of the intersection point between the third edge and the fourth edge on the second edge may be located on two sides of an intersection point between the first edge and the second edge, or the injection of the intersection point between the third edge and the fourth edge on the second edge may coincide with the intersection point between the first edge and the second edge, the growth of the GaN epitaxial layer in a perpendicular direction may be prevented by the intersection point between the third edge and the fourth edge. Therefore, the GaN epitaxial layer may be only grown laterally, so that the lateral epitaxial growth of the GaN epitaxial layer in the groove structures may be achieved by the substrate structure having a groove structure having a lateral epitaxial pattern in a cross section. Accordingly, the density of defects in the epitaxial layer may be reduced, and the quality of crystal in the epitaxial layer may be improved, and consequently the internal quantum efficiency and the performance of the LED may be improved.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the present disclosure will become apparent and more readily appreciated from the following descriptions taken in conjunction with the drawings in which.

DETAILED DESCRIPTION

Figure 1:
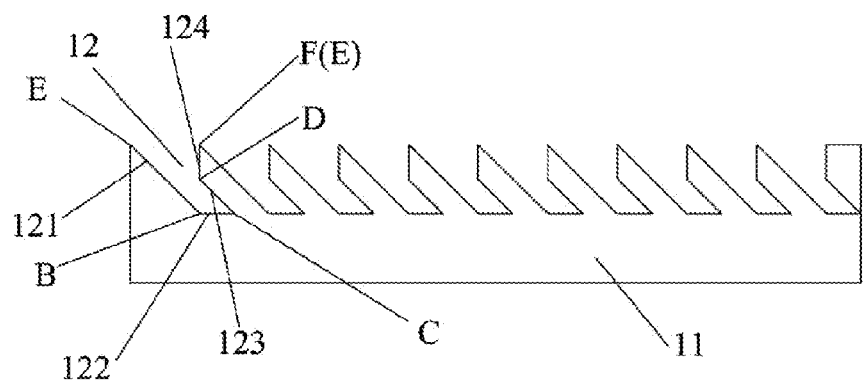
FIG. 1 is a cross-sectional view of a substrate structure according to an embodiment of the present disclosure.

Reference will be made in detail to embodiments of the present disclosure. The embodiments described herein are explanatory, illustrative, and used to generally understand the present disclosure. The embodiments shall not be construed to limit the present disclosure. The same or similar elements and the elements having same or similar functions are denoted by like reference numerals throughout the descriptions.

Figure 2:
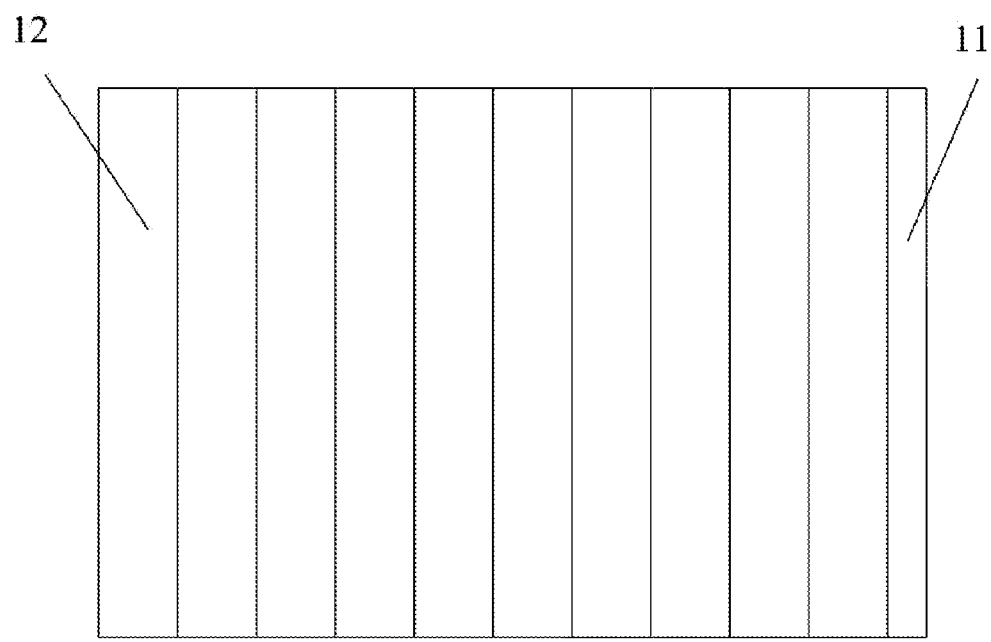
FIG. 2 is a top view of the substrate structure in FIG. 1.

According to an aspect of the present disclosure, a substrate structure is provided. As shown in FIGS. 1, 2, the substrate structure comprises a substrate 11, and a groove structure 12 formed on a surface of the substrate 11. The groove structure 12 has a lateral epitaxial pattern in a cross section perpendicular to the surface of the substrate 11. The substrate 11 may be formed by any material known to those skilled in the art, for example, sapphire, silicon carbide or silicon, preferably sapphire. There are no limits on the shape of the substrate 11, and any shape such as a round shape or a square shape may be used. The thickness of the substrate structure 11 may be in a range of 70 μm to 120 μm.

Figure 4:
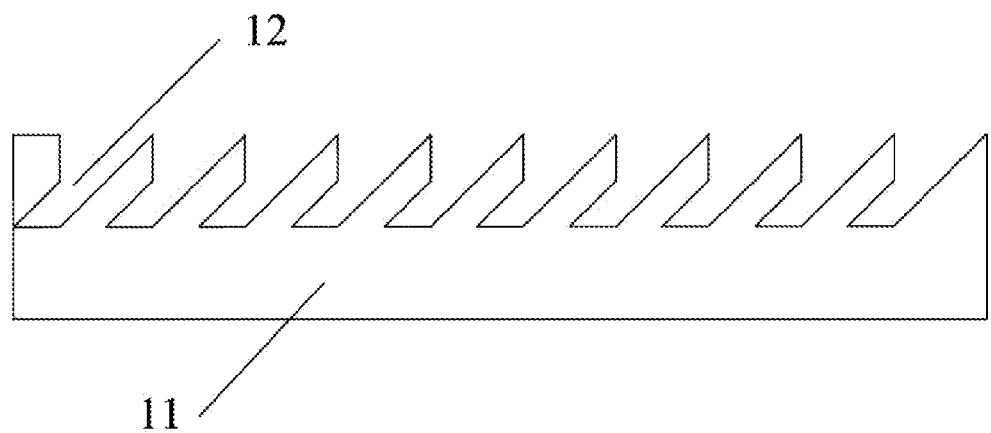
FIG. 4 is a cross-sectional view of a substrate structure according to yet another embodiment of the present disclosure.

The lateral epitaxial pattern comprises a first edge 121, a second edge 122, a third edge 123, and a fourth edge 124. The first edge 121 is inclined with respect to the surface of the substrate 11. The second edge 122 is adjacent to the first edge 121 and parallel to the surface of the substrate 11. The third edge 123 is parallel to the first edge 121, having a projection C on the surface of the substrate 11 at least entirely covering the second edge 122. The fourth edge 124 is adjacent to the third edge 123. The first edge 121 and the third edge 123 may be inclined with respect to the second edge 122 from left to right as shown in FIG. 1, thus forming an obtuse angle between the first edge 121 and the second edge 122. The first edge 121 and the third edge 123 may also be inclined with respect to the second edge 122 from right to left as shown in FIG. 4, thus forming an acute angle between the first edge 121 and the second edge 122. The second edge 122 is the bottom of the groove structure 12. In one embodiment, an intersection point C between the second edge 122 and the third edge 123 on the second edge 122 and an injection of an intersection point D between the third edge 123 and the fourth edge 124 on the second edge 122 may be located on two sides of an intersection point B between the first edge 121 and the second edge 122. In another embodiment, the injection of the intersection point D between the third edge 123 and the fourth edge 124 on the second edge 122 may coincide with the intersection point B between the first edge 121 and the second edge 122. In a further embodiment, a perpendicular foot of the fourth edge 124 on the second edge 122 may coincide with the injection of the intersection point D between the third edge 123 and the fourth edge 124 on the second edge 122. That is, the fourth edge 124 is perpendicular to the second edge 122. In one embodiment, the perpendicular foot of the fourth edge 124 on the second edge 122 may coincide with the intersection point B between the first edge 121 and the second edge 122. That is, a line for connecting the intersection point B between the first edge 121 and the second edge 122 with the intersection point D between the third edge 123 and the fourth edge 124 is perpendicular to the surface of the substrate 11.

In one embodiment, an angle between the second edge 122 and the fourth edge 124 may be an acute angle. In another embodiment, the angle between the second edge 122 and the fourth edge 124 may be an obtuse angle. In a further embodiment, the second edge 122 is perpendicular to the fourth edge 124, thus further decreasing the density of defects in the epitaxial layer.

For a patterned substrate structure, a GaN epitaxial layer may be grown in the groove structure having a lateral epitaxial pattern in a cross section. In one embodiment, the GaN epitaxial layer is grown in the groove structure 12. In the initial growth period, the growth of the GaN epitaxial layer is limited in an area formed by the first edge 121, the second edge 122 and the third edge 123. Because the intersection point C between the second edge 122 and the third edge 123 on the second edge 122 and the injection of the intersection point D between the third edge 123 and the fourth edge 124 on the second edge 122 may be located on two sides of an intersection point B between the first edge 121 and the second edge 122, or the injection of the intersection point D between the third edge 123 and the fourth edge 124 on the second edge 122 may coincide with the intersection point B between the first edge 121 and the second edge 122, the growth of the GaN epitaxial layer in a perpendicular direction may be prevented by the intersection point D between the third edge 123 and the fourth edge 124. Therefore, the GaN epitaxial layer may be only grown laterally, so that the lateral epitaxial growth of the GaN epitaxial layer in the groove structures may be achieved by the substrate structure having a groove structure having a lateral epitaxial pattern in a cross section. Accordingly, the density of defects in the epitaxial layer may be reduced, and the quality of crystal in the epitaxial layer may be improved, and consequently the internal quantum efficiency and the performance of the LED may be improved.

Figure 3:
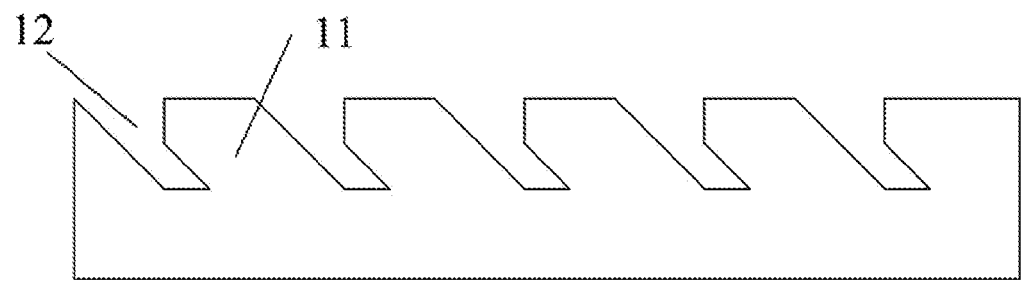
FIG. 3 is a cross-sectional view of a substrate structure according to another embodiment of the present disclosure.

In one embodiment, in order to form a groove structure 12 on the entire substrate 11, at least two groove structures 12 may be formed in a width direction of the substrate 11, and the at least two groove structures 12 extend in a longitudinal direction of the substrate 11, as shown in FIG. 3. In one embodiment, a free point F on the fourth edge 124 of a former groove structure may connect with a free point E on the first edge 121 of a later groove structure, as shown in FIG. 3, to improve the utilization ratio of the substrate 11. In an alternative embodiment, the free point F on the fourth edge 124 of the former groove structure may coincide with the free point E on the first edge 121 of the later groove structure, as shown in FIG. 1. Referring to FIG. 1, two adjacent groove structures 12 are directly connected with each other with no gaps therebetween. Thus, the utilization ratio of the substrate 11 may be further improved.

In one embodiment, an angle between the first edge 121 and the second edge 122 may range from about 30° to about 60°. In an alternative embodiment, the angle between the first edge 121 and the second edge 122 may be about 43.5°. Thus, the GaN epitaxial layer may be grown on the first edge 121. The first edge 121 is parallel to the third edge 123, and therefore a sum of the angle between the first edge 121 and the second edge 122 and an angle between the third edge 123 and the second edge 122 is 180°.

In one embodiment, the second edge 122 may have a length ranging from about 0.01 µm to about 2.00 µm. In an alternative embodiment, the second edge 122 may have a length ranging from about 0.6 µm to about 0.8 µm. In this way, more groove structures 12 may be formed in a substrate 11 with a predetermined size. Therefore, the lateral epitaxial area may be increased to a greater extent, so the density of defects in the epitaxial layer formed on the substrate 11 may be reduced, and the quality of crystal may be improved. Thus, the internal quantum efficiency and the performance of the LED may be improved. Furthermore, the combination of GaN epitaxial layers formed in two adjacent groove structures may be facilitated, thus further improving the quality of crystal and improving the performance and the internal quantum efficiency of the LED.

In one embodiment, a length of an opening of the groove structure 12, i.e., a distance between the free point E on the first edge 121 of the groove structure and the free point F on the fourth edge 124 of the groove structure, may range from about 0.6 µm to about 3.00 µm. In an alternative embodiment, the length of the opening of the groove structure 12 may range from about 1.2 µm to about 1.5 µm. In this way, the lateral epitaxial area may be increased to a greater extent and the combination of GaN epitaxial layers formed in two adjacent groove structures may be facilitated, thus further improving the quality of crystal.

Figure 11:
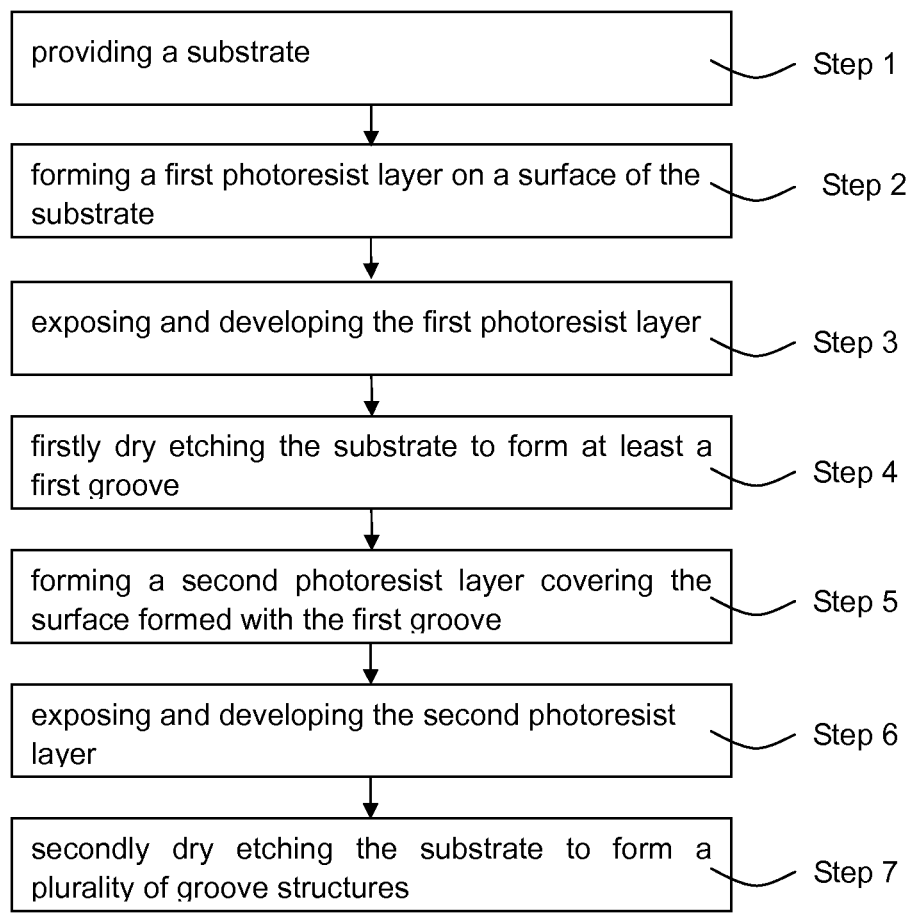
FIG. 11 is a flow chart of a method of forming a substrate structure according to an embodiment of the present disclosure.

According to another aspect of the present disclosure, a method of forming the substrate structure described above is provided. Referring to FIG. 11, the method comprises the steps of:

step 1), providing a substrate 11;

step 2), forming a first photoresist layer 13 on a surface of the substrate 11;

step 3), exposing and developing the first photoresist layer 13 by a first mask, and an angle between a direction of the incident lights and the top surface of the substrate structure 11 being an acute angle;

step 4), firstly dry etching the substrate structure 11 to form at least a first groove 15, in which a direction of the first dry etching is the same as the direction of the incident lights in the exposing step in the step 3);

step 5), forming a second photoresist layer 14 covering the surface formed with the first groove 15;

step 6), exposing and developing the second photoresist layer 14 by a second mask, forming the second photoresist layer 14 above the first groove 15; and step 7), secondly dry etching the substrate 11 to form at least a groove structure 12, in which a direction of the second dry etching is the same as a direction of incident lights in the exposing step in step 6), the groove structure 12 has a lateral epitaxial pattern in a cross section perpendicular to the surface of the substrate 11, and the epitaxial pattern comprises a first edge 121, a second edge 122, a third edge 123, and a fourth edge 124, in which the first edge 121 is inclined with respect to the surface of the substrate 11, the second edge 122 is adjacent to the first edge 121 and parallel to the surface of the substrate 11, the third edge 123 is parallel to the first edge 121, having a projection on the surface of the substrate 11 at least entirely covering the second edge 122, and the fourth edge 124 is adjacent to the third edge 123.

In one embodiment, an intersection point C between the second edge 122 and the third edge 123 on the second edge 122 and an injection of an intersection point D between the third edge 123 and the fourth edge 124 on the second edge 122 may be located on two sides of an intersection point B between the first edge 121 and the second edge 122. In another embodiment, the injection of the intersection point D between the third edge 123 and the fourth edge 124 on the second edge 122 may coincide with the intersection point B between the first edge 121 and the second edge 122.

In one embodiment, the substrate 11 in the step 1) may be any conventional LED substrate, for example, one selected from the group consisting of a sapphire substrate, a silicon carbide substrate, and a silicon substrate. In an alternative embodiment, the substrate 11 is a sapphire substrate. There are no limits on the shape of the substrate 11, and any shape such as a round shape or a square shape may be used. In one embodiment, the thickness of the substrate 11 may range from about 70 µm to about 120 µm.

Figure 5:
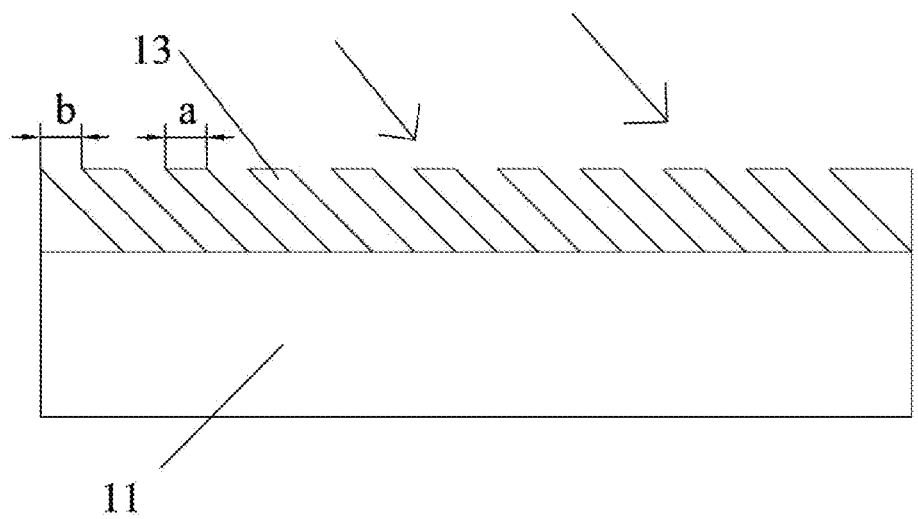
FIG. 5 is a cross-sectional view of a substrate structure formed with a first photoresist layer according to an embodiment of the present disclosure.

In one embodiment, in the step 3), the first mask may comprise a base plate and a plurality of strip through holes formed in the base plate. The angle between the direction of the incident lights and the top surface of the substrate 11 may be an acute angle, thus forming a first photoresist layer 13 on the substrate 11, as shown in FIG. 5. Referring to FIG. 5, a cross section of the first photoresist layer 13 is a parallelogram, in which two opposite edges (i.e., a top edge and a lower edge) are parallel to the surface of the substrate 11, a first edge (the top edge) may coincide with the surface of the substrate 11, and the second edge (the lower edge) is located below the first edge. In one embodiment, the distance between every two adjacent through holes in the first mask may equal to the distance a between two adjacent a of the remaining first photoresist layers 13 formed on the substrate 11, and the width of each through hole may equal to the width b of the exposed first photoresist layer 13. In this way, the distance a and the width b may be adjusted by changing the distance between two adjacent through holes and the width of each through hole.

In one embodiment, the angle between the direction of the incident lights and the surface of the substrate may range from about 30° to about 60°, alternatively 43.5°, in the exposing step in the step 3). The direction of the incident light may be a direction shown by arrows in FIG. 5. Alternatively, by taking the normal line of the incident lights as a symmetric axis, a direction symmetric to the direction shown by arrows in FIG. 5 may also be the direction of the incident lights in the exposing step in the step 3). In one embodiment, if the incident lights are applied to the substrate 11 in the direction symmetric to the direction shown by arrows in FIG. 5 and then the steps 4) to 8) are performed, then a substrate structure shown in FIG. 4 may be fabricated.

Figure 6:
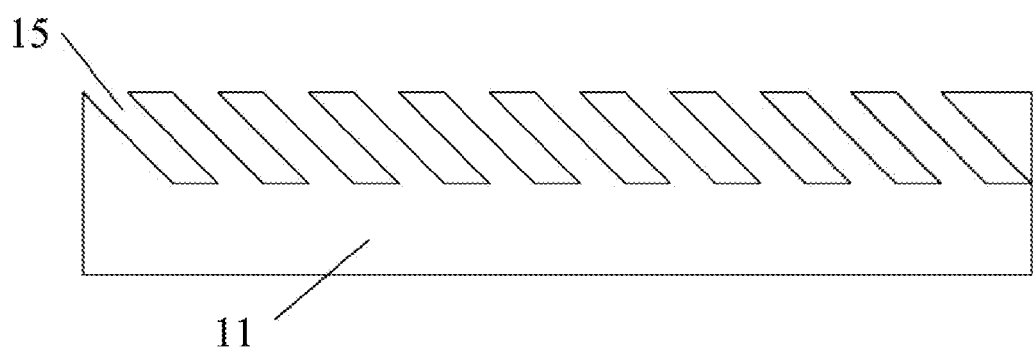
FIG. 6 is a cross-sectional view of a substrate structure after a first etching according to an embodiment of the present disclosure.

In one embodiment, if the first photoresist layer 13 shown in FIG. 5 is formed on the substrate 11 and the direction of the first dry etching in the step 4) may be the same as the direction of the incident lights in the exposing step in the step 3), then the shape of the first groove 15 formed on the substrate 11 may be the same as that of the remaining first photoresist layer 13, as shown in FIG. 6.

Figure 7:
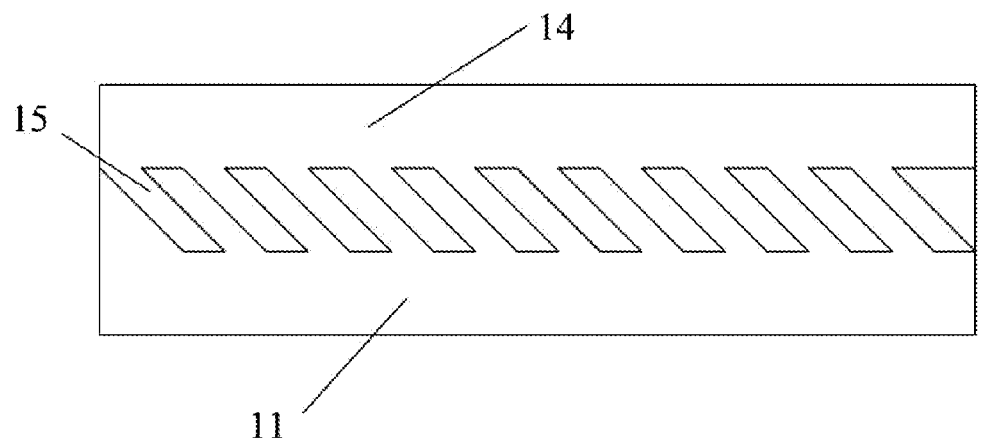
FIG. 7 is a cross-sectional view of a substrate structure formed with a second photoresist layer according to an embodiment of the present disclosure.

In one embodiment, a second photoresist layer 14 may be formed on the substrate 11 shown in FIG. 6, as shown in FIG. 7.

In one embodiment, the direction of the incident lights in the step 6) is perpendicular to the surface of the substrate 11, which may simplify the fabricating process of the substrate structure 1. Therefore, in the step 7), the direction of the second dry etching is also perpendicular to the surface of the substrate 11. In this way, at least a groove structure 12 having a lateral epitaxial pattern in a cross section may be formed in the substrate 11.

In one embodiment, the second mask may comprise a base plate and a plurality of strip through holes formed in the base plate. The step 6) may comprise: covering the substrate 11 by the second mask, with the through holes in the second mask aligned with a portion of the substrate 11 between every two adjacent first grooves 15; and exposing and developing the second photoresist layer 14.

Figure 8:
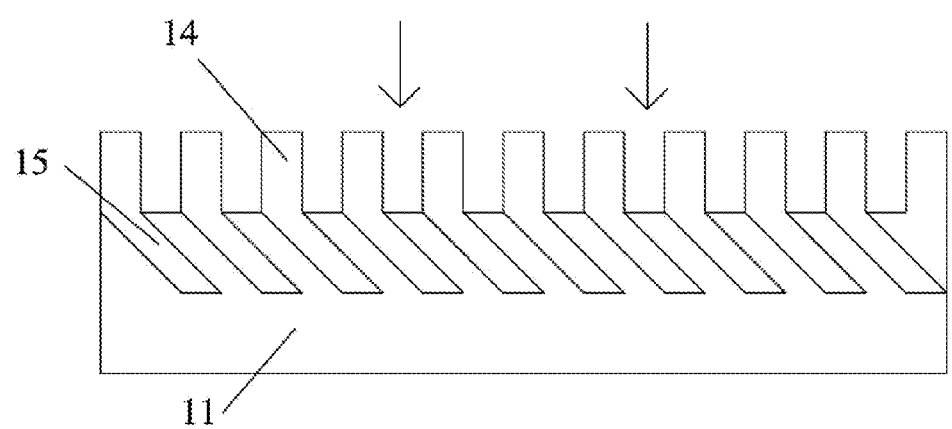
FIG. 8 is a cross-sectional view of a substrate structure formed with a second photoresist layer according to another embodiment of the present disclosure.

In one embodiment, the second photoresist layer 14 may be exposed and developed by the second mask. The second mask may comprise a base plate and a plurality of strip through holes formed in the base plate. The width of the exposed second photoresist layer 14 may be equal to the width of each strip through hole, and the width of the remaining second photoresist layer 14 may be equal to the distance between every two adjacent through holes. In the exposing step in the step 6), the incident lights may be applied on the substrate 11 covered by the second mask in a direction perpendicular to the surface of the substrate 11, with the through holes in the second mask aligned with a portion of the substrate 11 between every two adjacent first grooves 15. Therefore, the through holes in the second mask may not be located above the plurality of first grooves 15, and the second photoresist layer 14 shown in FIG. 8 may be formed on the substrate 11. Referring to FIG. 8, after the exposing step in the step 6), the remaining second photoresist layer 14 is formed above the portion of the substrate 11 between two adjacent first grooves 15. The second photoresist layer 14 has a rectangular cross section. In one embodiment, if the width of each through hole in the second mask is smaller than the distance between every two adjacent first grooves 15, when the etching in the step 7) is performed, the top section of the substrate 11 between two adjacent first grooves 15 may not be removed by etching. Thus, an intersection part may be formed between two adjacent groove structures 12. In one embodiment, the distance between two adjacent through holes in the second mask may equal to the distance between two adjacent first grooves 15 to reduce the density of defects in the epitaxial layer on the substrate 11. After the second dry etching in the step 7) is performed, a substrate structure 1 shown in FIG. 1 may be formed. In this way, the utilization ratio of the substrate is improved, and the density of defects in the epitaxial layer is reduced. In one embodiment, the first mask and the second mask may have a same structure, and consequently in the exposing step in the step 6), the first mask may be moved with respect to the second mask so as to fabricate the substrate structure having a lateral epitaxial pattern in a cross section.

In one embodiment, the step 4) may further comprise a step of cleaning the substrate 11 to remove the extra first photoresist layer 13 after the first dry etching.

In one embodiment, the step 8) may further comprise a step of cleaning the substrate 11 to remove the extra second photoresist layer 14 after the second dry etching.

Cleaning the substrate 11 to remove the extra first photoresist layer 13 may favor the subsequent steps of forming the second photoresist layer 14 and the second dry etching, and cleaning the substrate 11 to remove the extra second photoresist layer 14 may favor the formation of the groove structure 12 having a lateral epitaxial pattern in a cross section.

Figure 9:
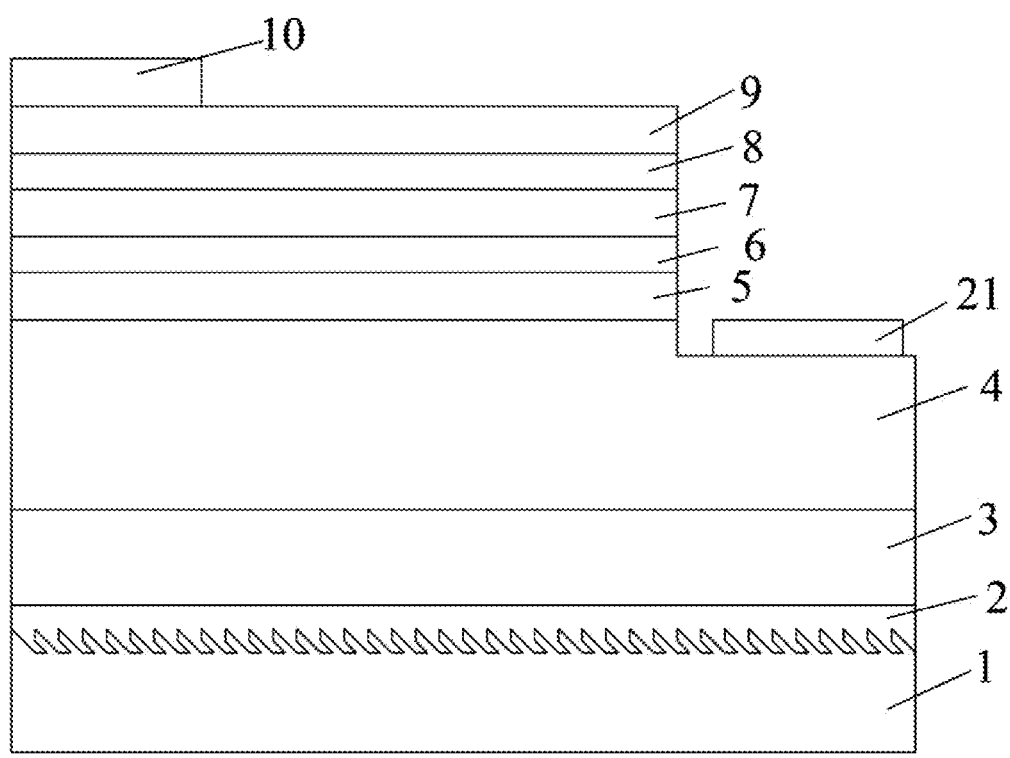
FIG. 9 is a cross-sectional view of a chip according to an embodiment of the present disclosure.

According to a further aspect of the present disclosure, a chip comprising the substrate structure described above is provided. Referring to FIG. 9, the chip comprises a substrate structure 1 having a lateral epitaxial pattern in a cross section, and an LED structure formed on the substrate structure 1. The LED structure comprises: an N-type GaN layer 4 formed on the substrate structure 1, a multiple quantum well luminous layer 5 formed on the N-type GaN layer 4, a P-type GaN layer formed on the multiple quantum well luminous layer 5, a conductive layer formed on the P-type GaN layer, a metal P-electrode 10 connected with the conductive layer, and a metal N-electrode 21 connected with the N-type GaN layer 4. Because the N-type GaN layer 4 grown on the substrate structure 1 may only grow laterally in the groove structure 12, the density of defects in the epitaxial layer is reduced, and the quality of crystal in the epitaxial layer is improved. Therefore, the performance and the internal quantum efficiency of the LED chip are both improved.

In one embodiment, the LED chip further comprises a GaN nucleation layer 2 and an intrinsic GaN layer 3 formed between the substrate structure 1 and the N-type GaN layer 4. The GaN nucleation layer 2 may be formed on the substrate structure 1 by metal organic compound vapor deposition. The formation of the GaN nucleation layer 2 may reduce the crystal lattice mismatch between the substrate structure 1 and the GaN eptitaxial layer 4, and release the stress, and thus the quality of crystal in the GaN epitaxial layer 4 may be improved. During the growth of intrinsic GaN layer, the lateral epitaxial growth of GaN layers above the groove structure 12 of the substrate structure 1 may be achieved by controlling process parameters, such as a temperature, a pressure and a proportion of group III/V compounds. The intrinsic GaN layer 3 may improve the electro-static discharge (ESD) performance of the LED. In one embodiment, the N-type GaN layer 4 may be a silicon-doped N-type GaN layer.

In one embodiment, the chip may comprise an AlGaN electron barrier layer 6 formed between the multiple quantum well luminous layer 5 and the P-type GaN layer. The AlGaN electron barrier layer 6 may prevent electrons in the multiple quantum well from diffusing toward the P-type GaN layer, thus improving the internal quantum efficiency. In one embodiment, the multiple quantum well luminous layer 5 may be an $In_xGa_{1-x}N/GaN$ multiple quantum well luminous layer. The multiple quantum well luminous layer 5 may have be selected from the group consisting of: an $In_xGa_{1-x}N/GaN$ layer (0<x<1), an $In_xGa_{1-x}N/Al_yGa_{1-y}N$ layer (0<x<1, 0<y<1), an $Al_xGa_yIn_{1-x-y}N/Ga_{1-z}N$ layer (0<x<1, 0<y<1, x+y<1), and an $Al_xGa_yIn_{1-x-y}N/Al_zGa_{1-z}N$ layer (0<x<1, 0<y<1, x+y<1, z<1). A well layer in the quantum well may have a thickness ranging from about 2 nm to about 3 nm, and a barrier layer in the quantum well may have a thickness ranging from about 8 nm to about 15 nm. The period of the quantum well may be 5 cycles to 7 cycles. The growing temperature of the multiple quantum well may range from about 700° C. to about 850.

In one embodiment, the P-type GaN layer may comprise a Mg-doped P-type GaN layer 7 formed on the multiple quantum well luminous layer 5. In another embodiment, the Mg-doped P-type GaN layer 7 may be formed on the AlGaN electron barrier layer 6. The Mg-doped P-type GaN layer 7 may improve the ohm contact between the epitaxial layer and the conductive layer. In a further embodiment, the chip may further comprise a heavily doped P-type InGaN layer 8 formed on the Mg-doped GaN layer 7, and the conductive layer may be grown on the heavily doped P-type InGaN layer 8. In one embodiment, the conductive layer may be a transparent conductive layer 9, and the transparent conductive layer 9 may be formed by a material selected from the group consisting of: ITO (indium tin oxide), and one selected from a CTO alloy, a ZnO/Al alloy, a Ni/Au alloy, a Ni/Pd/Au alloy, and a Pt/Au alloy.

In one embodiment, the metal P-electrode 10 may be formed by a Ti/Au alloy, or an alloy comprising at least two metals selected from the group consisting of: Ni, Au, Al, Ti, Pd, Pt, Sn, and Cr. The metal P-electrode 10 may have a thickness of about 0.2 μm to about 1 μm. In one embodiment, the metal N-electrode 21 may be formed by a Ti/Al alloy, or an alloy comprising at least two metals selected from the group consisting of: Ti, Al, Au, Pt, and Sn. The metal N-electrode 21 may have a thickness of about 0.2 μm to about 1 μm.

Figure 10:
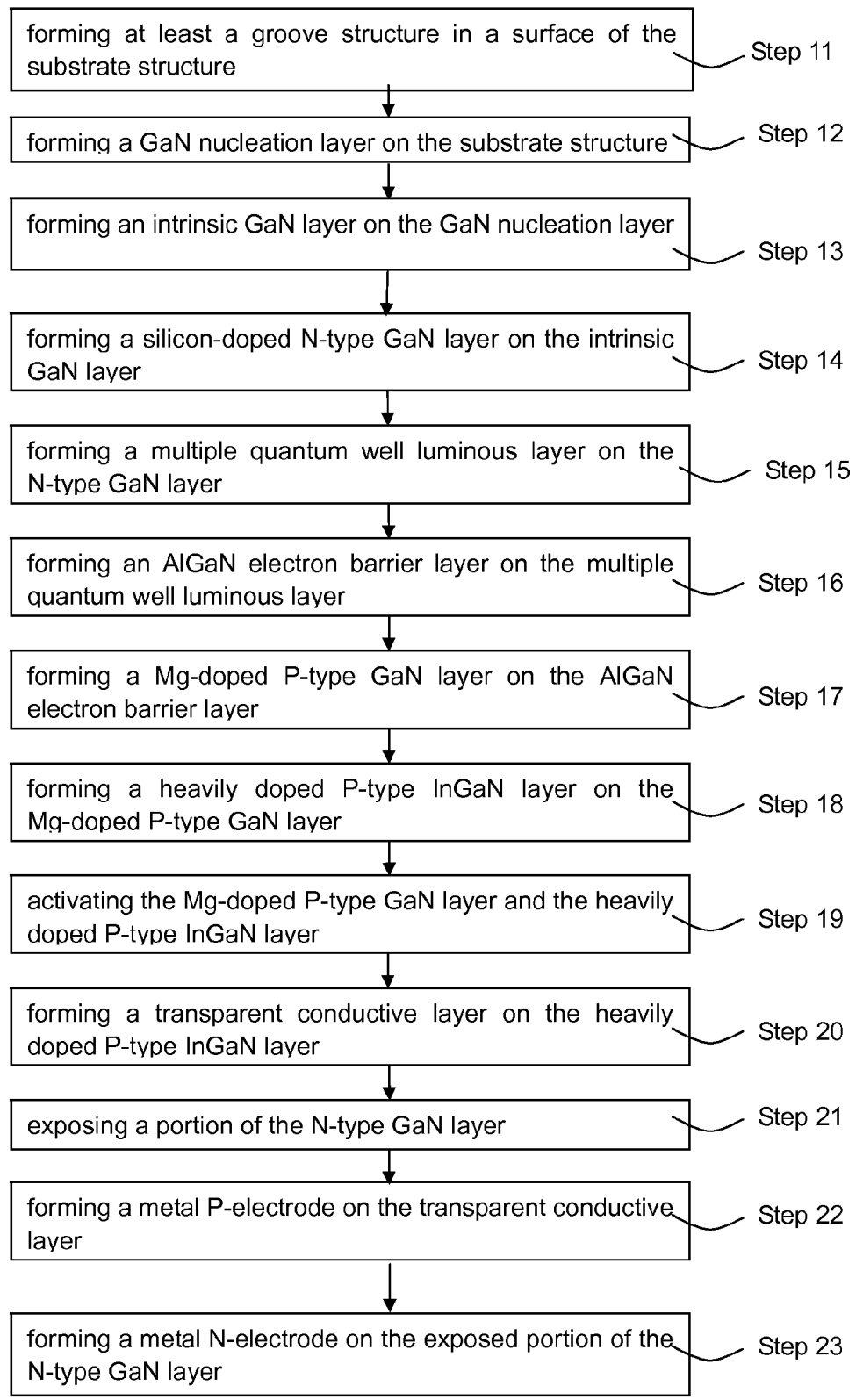
FIG. 10 is a flow chart of a method of forming a chip according to an embodiment of the present disclosure.

According to a further aspect of the present disclosure, a method of forming the chip described above is provided. As shown in FIG. 10, a flow chart of forming the chip is illustrated, which comprises the steps of:

step 11), dry etching the substrate structure 1 to form at least a groove structure in a surface of the substrate structure 1, the groove structure having a lateral epitaxial pattern in a cross section, and the method of forming the substrate structure 1 being shown in FIG. 11;

step 12), forming a GaN nucleation layer 2 on the substrate structure 1 by metal organic compound vapor deposition;

step 13), forming an intrinsic GaN layer 3 on the GaN nucleation layer 2 at a high temperature;

step 14), forming a silicon-doped N-type GaN layer 4 on the intrinsic GaN layer 3;

step 15), forming a multiple quantum well luminous layer 5 on the N-type GaN layer 4;

step 16), forming a AlGaN electron barrier layer 6 on the multiple quantum well luminous layer 5;

step 17), forming a Mg-doped P-type GaN layer 7 on the AlGaN electron barrier layer 6;

step 18), forming a heavily doped P-type InGaN layer 8 on the Mg-doped P-type GaN layer 7;

step 19), activating the Mg-doped P-type GaN layer 7 and the heavily doped P-type InGaN layer 8;

step 20), forming a transparent conductive layer 9 on the heavily doped P-type InGaN layer 8 by evaporation;

step 21), dry etching a portion of the transparent conductive layer 9, the heavily doped P-type InGaN layer 8, the Mg-doped P-type GaN layer 7, the AlGaN electron barrier layer 6, and the multiple quantum well luminous layer 5 to expose a portion of the N-type GaN layer 4;

step 22), forming a metal P-electrode 10 on the transparent conductive layer 9 by evaporation; and step 23), forming a metal N-electrode 21 on the exposed portion of the N-type GaN layer 4.

In one embodiment, the activating in the step 19) may be performed by annealing the Mg-doped P-type GaN layer 7 or the heavily doped P-type InGaN layer 8 rapidly at a temperature of about 600° C. to about 800° C. under vacuum or nitrogen atmosphere. In another embodiment, the activating in the step 19) may be performed by ion beam bombardment.

A exemplary embodiment of the present application overcomes the problem of high density of defects in the epitaxial layer on the substrate structure of an LED, and provides a substrate structure which improves the internal quantum efficiency and the performance of LEDs. The method of forming the substrate structure and a chip comprising the substrate structure are also provided.

Although explanatory embodiments have been shown and described, it would be appreciated by those skilled in the art that changes, alternatives, and modifications may be made in the embodiments without departing from spirit and principles of the disclosure. The changes, alternatives, and modifications all fall into the scope of the claims and their equivalents.

What is claimed is:

1. A substrate structure, comprising:
   a substrate; and
   at least a groove structure formed on a surface of the substrate, the groove structure having a lateral epitaxial pattern in a cross section perpendicular to the surface of the substrate,
   wherein the lateral epitaxial pattern comprises:
   a first edge inclined with respect to the surface of the substrate;
   a second edge adjacent to the first edge and parallel to the surface of the substrate;
   a third edge parallel to the first edge, having a projection on the surface of the substrate at least entirely covering the second edge; and
   a fourth edge adjacent to the third edge,
   in which the second edge is the bottom of the groove structure; and a first intersection point between the second edge and the third edge on the second edge and an injection of a second intersection point between the third edge and the fourth edge on the second edge are located on two sides of a third intersection point between the first edge and the second edge, or the injection of the second intersection point between the third edge and the fourth edge on the second edge coincides with the third intersection point between the first edge and the second edge.

2. The substrate structure according to claim 1, wherein the fourth edge is perpendicular to the second edge.

3. The substrate structure according to claim 1, wherein at least two groove structures are formed on the substrate, and a first free point on the fourth edge of a former groove structure connects with a second free point on the first edge of a later groove structure.

4. The substrate structure according to claim 1, wherein an angle between the first edge and the second edge ranges from about 30° to about 60°.

5. The substrate structure according to claim 1, wherein a length of the second edge ranges from about 0.01 μm to about 2.00 μm.

6. The substrate structure according to claim 3, wherein a distance between the first free point on the first edge of the groove structure and the second free point on the fourth edge of the groove structure ranges from 0.6 μm to about 3.00 μm.

7. The substrate structure according to claim 1, wherein the substrate is a sapphire substrate.

8. A method of forming a substrate structure, comprising the steps of:
1) providing a substrate;
2) forming a first photoresist layer on a surface of the substrate;
3) exposing and developing the first photoresist layer by a first mask, and an angle between the surface of the substrate and a direction of incident lights in the exposing step being an acute angle;
4) firstly dry etching the substrate to form at least a first groove, in which a direction of the first dry etching is the same as the direction of the incident lights in the exposing step in the step 3);
5) forming a second photoresist layer covering the surface formed with the first groove;
6) exposing and developing the second photoresist layer by a second mask, and forming the second photoresist layer above the first groove; and
7) secondly dry etching the substrate to form at least a groove structure, the groove structure having a lateral epitaxial pattern in a cross section perpendicular to the surface of the substrate, and a direction of the second dry etching in the step 7) being the same as a direction of incident lights in the exposing step in the step 6),
wherein the lateral epitaxial pattern comprises:
a first edge inclined with respect to the surface of the substrate;
a second edge adjacent to the first edge and parallel to the surface of the substrate;
a third edge parallel to the first edge, having a projection on the surface of the substrate at least entirely covering the second edge; and
a fourth edge adjacent to the third edge,
in which the second edge is the bottom of the groove structure; and a first intersection point between the second edge and the third edge on the second edge and an injection of a second intersection point between the third edge and the fourth edge on the second edge are located on two sides of a third intersection point between the first edge and the second edge, or the injection of the second intersection point between the third edge and the fourth edge on the second edge coincides with the third intersection point between the first edge and the second edge.

9. The method according to claim 8, wherein the direction of the incident lights is perpendicular to the surface of the substrate in the step 6).

10. The method according to claim 8, wherein the step 4) further comprises:
cleaning the substrate to remove the extra first photoresist layer after the first dry etching.

11. The method according to claim 8, wherein the step 7) further comprises:
cleaning the substrate to remove the extra second photoresist layer after the second dry etching.

12. The method according to claim 8, wherein the first mask and the second mask each comprises:
a base plate;
at least a strip hole formed in the base plate.

13. The method according to claim 12, wherein the fourth edge is perpendicular to the second edge.

14. The method according to claim 12, wherein an angle between the direction of the incident lights and the surface of the substrate ranges from about 30° to about 60°.

15. A chip, comprising:
a substrate structure comprising:
a substrate; and
at least a groove structure formed on a surface of the substrate, the groove structure having a lateral epitaxial pattern in a cross section perpendicular to the surface of the substrate,
wherein the lateral epitaxial pattern comprises:
a first edge inclined with respect to the surface of the substrate;
a second edge adjacent to the first edge and parallel to the surface of the substrate;
a third edge parallel to the first edge, having a projection on the surface of the substrate at least entirely covering the second edge; and
a fourth edge adjacent to the third edge,
in which the second edge is the bottom of the groove structure; and a first intersection point between the second edge and the third edge on the second edge and an injection of a second intersection point between the third edge and the fourth edge on the second edge are located on two sides of a third intersection point between the first edge and the second edge, or the injection of the second intersection point between the third edge and the fourth edge on the second edge coincides with the third intersection point between the first edge and the second edge; and
an LED structure formed on the substrate structure.

16. The chip according to claim 15, wherein the LED structure comprises:
an N-type GaN layer formed on the substrate structure;
a multiple quantum well luminous layer formed on the N-type GaN layer;
a P-type GaN layer formed on the multiple quantum well luminous layer;
a conductive layer formed on the P-type GaN layer;
a metal P-electrode connected with the conductive layer; and
a metal N-electrode connected with the N-type GaN layer.

17. The chip according to claim 16, further comprising:
a GaN nucleation layer and an intrinsic GaN layer formed between the substrate structure and the N-type GaN layer.

18. The chip according to claim 17, further comprising:
a AlGaN electron barrier layer formed between the multiple quantum well luminous layer and the P-type GaN layer.

19. The chip according to claim 17, wherein the P-type GaN layer comprises a Mg-doped P-type GaN layer formed on the multiple quantum well luminous layer.

* * * * *